United States Patent [19]
Kubik

[11] 3,974,556
[45] Aug. 17, 1976

[54] INTEGRATED CIRCUIT EXTRACTION TOOL

[75] Inventor: Peter Steve Kubik, South Plainfield, N.J.

[73] Assignee: Bell Telephone Laboratories, Incorporated, Murray Hill, N.J.

[22] Filed: Dec. 17, 1975

[21] Appl. No.: 641,650

[52] U.S. Cl. .............................. 29/203 B; 29/203 H; 29/278; 29/427
[51] Int. Cl.² ............................................ H05K 3/34
[58] Field of Search....... 29/203 B, 203 H, 203 HM, 29/278, 626, 427; 219/230; 228/19, 264

[56] References Cited
UNITED STATES PATENTS

| | | | |
|---|---|---|---|
| 3,538,580 | 11/1970 | Bruner | 29/203 H |
| 3,632,973 | 1/1972 | O'Keefe | 29/203 H X |
| 3,699,629 | 10/1972 | Hood, Jr. et al. | 29/203 H |

*Primary Examiner*—Carl E. Hall
*Attorney, Agent, or Firm*—J. W. Fisher

[57] ABSTRACT

A tool for extracting an integrated circuit package from a circuit board is disclosed. The tool has provision for converting a user applied compressive force into two components. One component actuates apparatus for grasping the underside of the circuit package while the other component produces a nearly uniform perpendicular force on apparatus which straddles the circuit package to effect the extraction.

8 Claims, 5 Drawing Figures

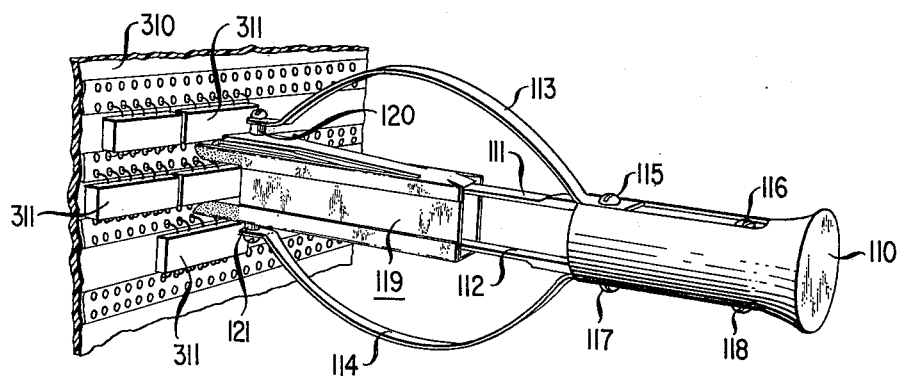
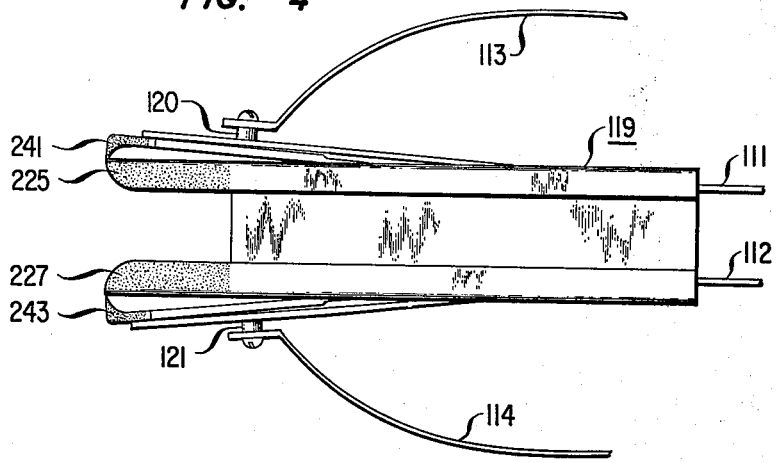
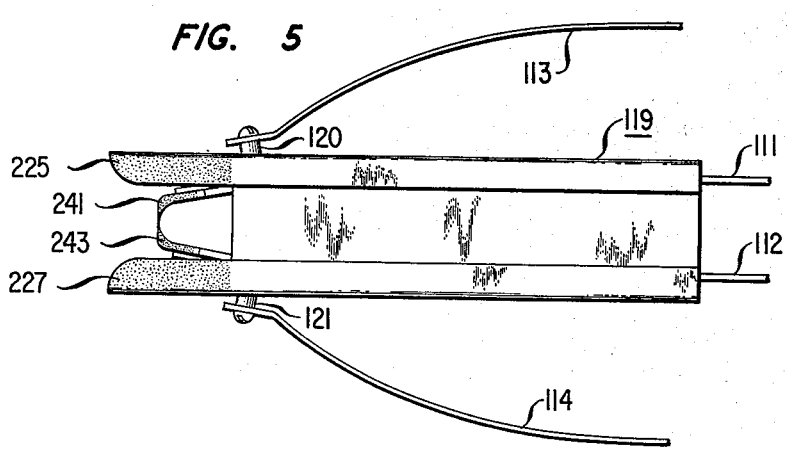

INTEGRATED CIRCUIT EXTRACTION TOOL

BACKGROUND OF THE INVENTION

1. Field of the Invention

This invention relates to apparatus for disassembling electrical circuitry and, in particular, to a tool for extracting an integrated circuit package from a circuit board.

2. Description of the Prior Art

A number of integrated circuit extraction tools, such as those disclosed in U.S. Pat. No. 3,797,092 issued to N. S. Einarson on Mar. 19, 1974, U.S. Pat. No. 3,602,971 issued to W. M. Halstead on Sept. 7, 1971 and U.S. Pat. No. 3,757,406 issued to W. Bezar on Sept. 11, 1973, have a generally plier-like appearance with the clamping ends having a number of slots for engaging the pins along the sidewalls of the integrated circuit package. Other extractors, such as that disclosed in U.S. Pat. No. 3,896,533 issued to R. Ullman et al. on July 29, 1975, have clamping ends which grasp the circuit package at its two end faces. Either of these general types of extractors tend to be somewhat large and cumbersome so that gaining access to an individual circuit package on a densely populated circuit board is extremely difficult if not impossible. For example, in circuits wherein the integrated circuit packages are mounted in a linear, end-to-end arrangement, the end grasping tools are virtually useless since access cannot be gained to at least one and perhaps both end faces.

Another type of extractor, such as that disclosed in U.S. Pat. No. 3,640,519 issued to W. M. Halstead on Feb. 8, 1972, has an alligator-type clip configuration for engaging a plurality of the pins along the sidewalls of the package. While this type of extractor is somewhat smaller in size than the above-described types, sufficient space must be available along the sidewalls between packages to permit the opening of the clip jaws to engage the pins of the integrated circuit.

It should be noted also that in all of the extractors referred to above, the direction of the extraction force is wholly dependent upon the user. That is, if the user is unsteady, it is quite possible that the extraction force will be applied at an angle rather than perpendicularly. Should this occur, misalignment or possibly even irreparable damage to the integrated circuit pins may result.

A further limitation in the prior art extractors is that the removal of a circuit while electrical power is applied thereto is extremely risky. For instance, any misstep in the grasping of an individual package on a relatively well-populated circuit board — should the grasping in fact be achievable — could result in a short circuit to one or more of the surrounding circuit packages. Consequently, power must be removed from the board in order to safely effect the extraction of a circuit package.

Accordingly, it is one object of the present invention to effect the individual extraction of an integrated circuit package from a densely populated circuit board.

Another object is to configure an integrated circuit extraction tool which controls the direction of the extraction force despite any misdirection in the force applied by the user.

A further object of the present invention is to provide an extraction tool which may be advantageously used while electrical power is applied to the circuit board.

SUMMARY OF THE INVENTION

The foregoing and other objects of the invention are realized in an illustrative embodiment of a tool for extracting an integrated circuit package from a circuit board, the circuit package having a first and a second plurality of equally spaced-apart pins affixed along parallel sidewalls. This extraction tool includes a handle member and means affixed to the handle member for grasping an underside of the circuit package about at least one pin of each of the first and second plurality of pins. The tool further includes means for straddling the circuit package perpendicular to the first and second plurality of pins. Integral with the straddling means are first and second pairs of parallel, spaced-apart legs. The straddling means and the grasping means are slidably coupled to one another. First and second oppositely directed bow springs each have one end affixed to the handle member and an opposite end affixed to the slidable coupling between the grasping means and the straddling means. These bow springs convert a compressive force applied to them into a compressive component and an extensive component. The compressive component actuates the grasping means whereas the extensive component shifts the straddling means downwardly away from the handle member thereby producing a nearly uniform perpendicular force on each of the parallel pairs of legs to effect the extraction of the circuit package by the grasping means.

Accordingly, it is one feature of the present invention that an integrated circuit package can be advantageously removed from a densely populated circuit board without having to remove any other packages in the vicinity of the subject package.

Another feature is that the application of a nearly uniform perpendicular extraction force to the circuit package ensures its removal without damage to the pins along the sidewalls of the package.

A further feature of the present invention is that an insulative layer encases both the first and second pairs of parallel, spaced-apart legs on the straddling means and a pair of right-angle bends on the grasping means so that an integrated circuit package can be advantageously extracted while electrical power is supplied to it.

BRIEF DESCRIPTION OF THE DRAWING

The aforementioned objects and features of the invention, as well as other objects and features, will be better understood upon a consideraton of the following detailed description and the appended claims taken in conjunction with the accompanying drawings in which:

FIG. 3 illustrates the use of the tool for extracting an integrated circuit; and FIGS. 4 and 5 illustrate the relative positions of the grasping means and the straddling means in an unoperated and operated condition, respectively.

DETAILED DESCRIPTION

Figure 1:
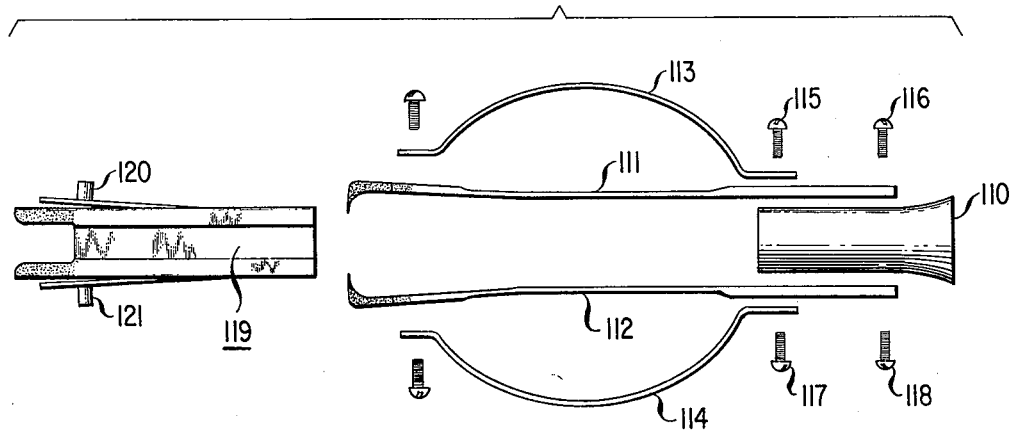
FIG. 1 is an exploded view of the integrated circuit extraction tool.

The integrated circuit extraction tool shown in the exploded view of FIG. 1, includes a handle member 110 and a pair of leaf springs 111 and 112. One end of each of the leaf springs 111 and 112 and one end of a pair of oppositely directed bow springs 113 and 114 are affixed to the handle member 110, for example, by screws 115 through 118. An elongated box-like member 119, having a hollow inner region and a generally rectangular cross section, fits over the free ends of the leaf springs 111 and 112. Member 119 has integral therewith a pair of tapped stand-offs 120 and 121 which provide a point of attachment for the opposite ends of bow springs 113 and 114, respectively. Additional details regarding the configuration of member 119 are shown more clearly in FIG. 2.

Figure 2:
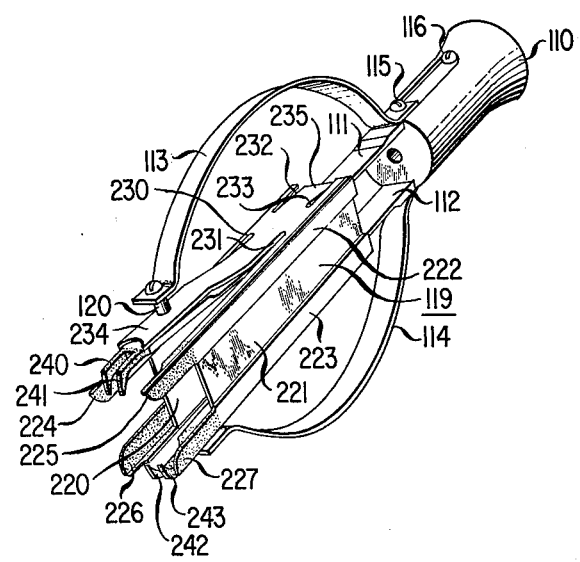
FIG. 2 is a perspective view of an assembled extraction tool.

As illustrated in FIG. 2, member 119 may include a pair of flat rectangular panel members 220 and 221 which are welded to a pair of generally U-shaped channel members 222 and 223. Each of the channel members 222 and 223 has an end portion opposite the handle member 110 which extends beyond the ends of the panel members 220 and 221. The extended end of the channel member 222 forms a pair of parallel, spaced-apart legs 224 and 225. Similarly, the extended end of the channel member 223 forms a pair of parallel, spaced-apart legs 226 and 227. The spacing between the legs 224 and 225 and the corresponding spacing between the legs 226 and 227 is an integer multiple of the spacing between the pins along the sidewalls of an integrated circuit package. The spacing between legs 224 and 226 and between legs 225 and 227 is approximately equal to the width dimension of an integrated circuit package. With the leg spacing as described, member 119 is capable of straddling an individual circuit package while at the same time avoiding contact with any adjacent circuit packages on a circuit board.

Channel member 222 has a pair of parallel cuts 230 and 231 along its length dimension toward the handle member 110 and a pair of parallel cuts 232 and 233 along its length dimension away from the handle member 110. The cuts 230 and 231 enable the lower portion of channel member 222 to function as a leaf spring 234. This configuration provides a flexible, slidable connection between the channel member 222, and leaf spring 111 during the grasping of an integrated circuit. In a similar manner the cuts 232 and 233 enable the upper portion of channel member 222 to function as a leaf spring 235. Leaf spring 235 provides a flexible, slidable connection between the channel member 222 and leaf spring 111 as member 119 moves downwardly away from handle member 110 during the extraction operation. A corresponding set of parallel cuts defining comparable leaf springs are included in channel member 223 but these are obscured from view in the drawing.

The free ends of leaf springs 111 and 112 have oppositely directed generally right-angle bends therein. These bends are machined to form pairs of hooks 240–241 and 242–243 in leaf springs 111 and 112, respectively. Preferably, the spacing between the hooks 240 and 241 and the spacing between the hooks 242 and 243 is approximately equal to the width of one of the pins emanating from the sidewall of the integrated circuit package. With this spacing between the hooks and with the direction of the bends being such that the hooks 240 and 241 oppose hooks 242 and 243, the two leaf springs 111 and 112, when compressed toward one another, grasp an underside of the circuit package enabling the package to be removed from the circuit board. The use of the extraction tool for the removal of an integrated circuit from a circuit board will be described more fully in a subsequent paragraph.

So that an integrated circuit package may be advantageously extracted from a circuit board while an electrical power is supplied thereto, the legs 224 through 227 and the hooks 240 through 243 are covered with a thin layer of insulating material which is illustrated in FIG. 2 by the different shading.

An illustration of how the extraction tool is used is shown in FIG. 3. Shown is a partial section of a circuit board 310 with a number of integrated circuit packages 311 mounted on it. It should be noted that the circuit packages 311 may be mounted end-to-end to that the packages generally abut one another. Moreover, to get relatively good utilization of the board area for circuit density, the lateral spacing between the circuit packages 311 may be held to only as much space as needed to ensure electrical isolation between the packages. Even with this degree of circuit density, the extraction tool may be advantageously utilized to extract a single circuit package 311 without having to remove first other packages 311 along the edges of the board 310.

As illustrated, the extraction tool, and, in particular, the member 119, is placed over the circuit package 311 to be extracted. In effect, member 119 straddles the circuit package 311 with the legs 224 through 227 aligned so as to pass through the gaps between the pins along the sidewalls of the package 311. At this point the hooks 240 through 243 are positioned near the ends of legs 224 through 227. This is shown more clearly in FIG. 4, although the hooks 240 through 243 are shown spread further apart than they are in actual use.

When the user squeezes the bow springs 113 and 114 toward one another two things occur. First, the free ends of leaf springs 111 and 112 are moved closer together so that the hooks 240 through 243 grasp the underside of the circuit package 311. Second, member 119 is forced downwardly away from the handle member 110. These two effects are shown in FIG. 5.

As member 119 moves in a direction away from the handle member 110, a nearly uniform perpendicular force is produced. This force results in the lifting of the circuit package 311 by the hooks 240 through 243. Since the force produced is nearly perpendicular, the circuit package 311 is extracted without any misalignment or damage to the pins along the sidewalls of the package.

In view of the foregoing, it will be appreciated that the bow springs 113 and 114 convert a compressive force, applied to them by the tool user, into a compressive component and an extensive component. The compressive component actuates the free ends of leaf springs 111 and 112 forcing them toward one another and thereby grasping the underside of the circuit package 311. The extensive component shifts the member 119 downwardly away from the handle member 110 thereby producing a nearly uniform perpendicular force of the pairs of parallel legs 224 through 227. This nearly perpendicular force, in conjunction with the grasping of the circuit package 311, effects the extraction of the package 311 from the circuit board 310.

In all cases it is to be understood that the above-described embodiment is illustrative of but a small number of many possible specific embodiments which can represent applications of the principles of the invention. Thus, numerous and various other embodiments can readily be devised in accordance with these principles by those skilled in the art without departing from the spirit and scope of the invention.

What is claimed is:

1. A tool for extracting an integrated circuit package from a circuit board, said circuit package having a first and a second plurality of equally spaced-apart pins affixed along parallel sidewalls, said tool including
- a handle member,
- means, affixed to said handle member, for grasping an underside of said circuit package about at least one pin of each of said first and second plurality of pins,
- means for straddling said circuit package perpendicular to said first and second plurality of pins, said straddling means including first and second pairs of parallel, spaced-apart legs,
- means for slidably coupling said straddling means to said grasping means, and
- first and second oppositely directed bow springs each of which has one end affixed to said handle member and an opposite end affixed to said coupling means, said bow springs converting a compressive force applied thereto into a compressive component and an extensive component, said compressive component actuating said grasping means and said extensive component shifting said straddling means downwardly away from said handle member thereby producing a nearly uniform perpendicular force on each of said parallel pairs of legs to effect the extraction of said circuit package by said grasping means.

2. The integrated circuit extraction tool in accordance with claim 1 wherein said grasping means includes
- first and second leaf springs, each of said springs having a pair of generally right-angle bends at an end opposite to an end affixed to said handle member, said bends having a space therebetween to accommodate the width of one of said pins affixed to said circuit package sidewalls, said bends on said first spring being directed toward said bends on said second spring.

3. The integrated circuit extraction tool in accordance with claim 2 wherein said grasping means further includes
- an insulative layer encasing said right-angle bends on said first and second leaf springs and said first and second pairs of parallel, spaced-apart legs on said straddling means, said insulative layer enabling the extraction of an integrated circuit while electrical power is supplied thereto.

4. The integrated circuit extraction tool in accordance with claim 1 wherein said straddling means includes
- first and second panel members spaced apart from one another by a predetermined distance, said panel members lying in parallel planes which are parallel with a plane containing said first and second oppositely directed bow springs, and
- first and second channel members spaced apart from one another by a width of said panel members, said channel members affixed to said panel members so as to lie in first and second parallel planes which are perpendicular to said plane containing said first and second bow springs, one end of each of said channel members extending beyond an end of said panel members by a predetermined distance in a direction away from said handle member, said extending end of each of said channel members forming said first and second pairs of parallel, spaced-apart legs.

5. The integrated circuit extraction tool in accordance with claim 4 wherein each of said first and second channel members further includes
- pairs of first and second parallel spaced-apart cuts of specified lengths along a length dimension so as to form a pair of oppositely directed cantilevered leaf springs for slidably supporting said straddling means about said grasping means.

6. The integrated circuit extraction tool in accordance with claim 1 wherein said coupling means includes
- first and second tapped pins each having one end portion for fixedly attaching an end of said bow springs to said straddling means.

7. A tool for extracting an integrated circuit package from a circuit board, said circuit package having a first and a second plurality of equally spaced-apart pins affixed along parallel sidewalls, said tool including,
- a handle member,
- first and second leaf springs, each of said springs having one end affixed to said handle member and a pair of generally right-angle bends at an opposite end for engaging an underside of said circuit package, said bends having a space therebetween to accommodate the width of one of said pins affixed to said circuit package sidewalls, said bends on said first spring being directed toward said bends on said second spring,
- first and second panel members spaced apart from one another by a predetermined distance, said panel members lying in parallel planes which are perpendicular to parallel planes containing said first and second leaf springs,
- first and second channel members spaced apart from one another by a width of said panel members, said channel members affixed to said panel members so as to lie in parallel planes which are parallel with said parallel planes containing said first and second leaf springs, one end of each of said channel members extending beyond an end of said panel members by a predetermined distance in a direction away from said handle member, said extending end of each of said channel members forming first and second pairs of parallel, spaced-apart legs,
- pairs of first and second parallel, spaced-apart cuts along a length dimension of each of said channel members so as to form a pair of oppositely directed cantilevered leaf springs for slidably supporting said channel members and said panel members which are affixed to said channel members about said first and second leaf springs,
- first and second tapped pins affixed to said first and second channel members, respectively, and
- first and second oppositely directed bow springs each of which has one end affixed to said handle member and an opposite end affixed to said tapped pins, said bow springs converting a compressive force applied thereto into a compressive component and an extensive component, said compressive component actuating said first and second leaf springs to grasp said circuit package and said extensive component shifting said channel members and said panel members affixed thereto downwardly away from said handle member thereby producing a nearly uniform perpendicular force on each of said parallel pairs of legs on said channel members to effect the extraction of said circuit package.

8. The integrated circuit extraction tool in accordance with claim 7 further including
- an insulative layer encasing said right-angle bends on said first and second leaf springs and said first and second pair of parallel, spaced-apart legs on said first and second channel members, said insulative layer enabling the extraction of an integrated circuit while electrical power is supplied thereto.

* * * * *